METHOD FOR FABRICATING SEMICONDUCTOR JUNCTIONS

Filed Feb. 16, 1971

EDWARD J. RICE
INVENTOR.

BY Spensley, Horn & Lubitz
ATTORNEYS 3,676,230

METHOD FOR FABRICATING SEMICONDUCTOR JUNCTIONS

Edward J. Rice, Los Angeles, Calif., assignor to TRW Inc., Los Angeles, Calif.

Filed Feb. 16, 1971, Ser. No. 115,411
Int. Cl. H01l 7/44
U.S. Cl. 148—187 29 Claims

ABSTRACT OF THE DISCLOSURE

A method for forming semiconductor junctions. A semiconductor material of a given conductivity is provided, two sequential passivating layers being disposed on the surface thereof, the passivating layers being adapted to be etched by mutually exclusive etching compounds. A portion of the semiconductor surface is exposed, the passivating layer adjacent the surface of the semiconductor material being undercut relative to the upper passivating layer. A doped oxide is disposed upon the semiconductor surface including that portion adjacent the undercut passivating layer. The doped oxide is etched in a manner leaving portions of the doped oxide in intimate contact with the surface of the semiconductor material substantially adjacent the undercut passivating layer. The dopant is then diffused into the semiconductor surface forming appropriate semiconductor junctions therein.

BACKGROUND OF THE INVENTION

(1) Field of the invention

The present invention method is generally related to the field of fabricating semiconductor devices and in particular those methods requiring accurate alignment of semiconductor junctions.

(2) Prior art

In the production of solid state devices, such as planar and mesa transistors, it has been the practice to produce thousands of such devices in a single wafer of semiconducting material using a multi-step chemical reproduction process. The techniques for fabricating such devices as disclosed in the prior art utilize a series of masks, each containing a repetitive array of a single element of the multiple element array required for fabrication of the device. By a succession of alignment and fabricating steps, the finished product can be constructed. A mask is normally used as a negative to expose a thin film of photosensitive material previously deposited on the wafer of semiconductor material in which the semiconductor devices are to be constructed. After exposure of the photosensitive material through the mask, the unexposed photoresist material is dissolved by appropriate solvents, but the exposed photoresist remains in place to act as a selective mask against the action of various chemical etchants.

A typical process disclosed by the prior art to fabricate the devices requiring formation of more than a single PN junction or a junction of the same conductivity type but of differing concentrations, e.g., P type and P+ type, require a series of process steps which lead to manufacturing problems which will be discussed in detail below. The firt step in the process disclosed by the prior art provides for utilizing a suitable wafer of single crystal silicon upon which an oxide layer is thermally grown. Next, the photosensitive resist material is applied upon the oxide and the surface is selectively exposed through a photomask to define a plurality of individual diffusion areas. The wafer is chemically processed to remove the unexposed resist material from the area to be procesed. The underlying oxide is then removed by an acid etchant, such as hydrofluoric acid, the remaining resist material defining the areas not to be processed by the etchant. The remaining resist is then removed and a PN junction or an area of the same conductivity type but differing concentration is formed by such processes such as diffusion. Where additional PN junctions or regions of differing concentrations are to be formed within the semiconductor wafer, the prior art requires duplication of the above referenced process steps.

In the fabrication of semiconductor devices such as planar and mesa transistors, region geometries and alignment of regions are extremely critical. Since the sequential alignment of a plurality of photomasks is necessary to permit processing of two or more areas upon the surface of the semiconductor wafer, the method disclosed by the prior art requires complex alignment procedures, large expenditures of time and energy as well as complex and costly equipment.

The present invention method substantially resolves the problems existing in those methods disclosed by the prior art. A pair of passivating layers are sequentially deposited upon the surface of the semiconductor wafer, each of the passivating layers being amenable to be etched by an etchant which will not affect the other passivating layer. The surface of the semiconductor wafer at which junctions are to be formed are exposed by conventional etching techniques, the passivating layer adjacent the semiconductor wafer surface being undercut exposing the location for the establishment of the junction. A doped oxide is disposed upon the wafer, including the volume created by the undercut passivating layer. The doped oxide is removed from the surface of the semiconductor wafer leaving a portion of the doped oxide substantially adjacent the undercut passivating layer after which the dopant contained in the oxide is diffused into the surface of the semiconductor wafer. The surface of the semiconductor wafer can now receive a second junction without the need for additional photoresist and etching operations.

BRIEF SUMMARY OF THE INVENTION

The present invention comprises a method for establishing at least two junctions within a semiconductor wafer through the use of only a single photolithographic process. It is understood that a junction shall mean the interface of materials of different type conductivity, e.g., P type and N type, or the interface of materials of the same type conductivity but of different concentrations, e.g., P type and P+ type. The fabrication of semiconductor devices require the establishment of several junctions within the semiconductor material. The alignment of the regions to be established within the semiconductor material has always been a highly critical operation. The present invention method provides means for establishing several junctions within the semiconductor material through the use of only a single photomasking and single junction forming process step.

A silicon wafer is provided as the base for the establishment of the semiconductor junctions, the semiconductor wafer typically being silicon. Two sequential passivating layers are disposed upon the surface of the silicon wafer, each passivating layer being subject to be etched by mutually exclusive etchants. A portion of the two passivating layers are removed thereby exposing the surface of the silicon wafer, the removal of the passivating layers typically being adapted to align the subsequent establishment of several junctions within the silicon wafer. The passivating layer adjacent the surface of the silicon wafer is etched until it has receded beneath the top passivating layer thereby creating an undercut region. A doped oxide is disposed upon the surface of the silicon wafer as well as the encompassing passivating layers. The undercut region is also subjected to the disposed oxide layer. The oxide layer is doped with a suitable dopant for subsequent establishment of the junctions within the silicon wafer. The doped oxide is removed in all but given regions within the undercut portion of the passivating layer adjacent the surface of the silicon wafer, the doped oxide remaining in the undercut portion due to the difficulty of etching in the undercut areas. The remaining portions of doped oxide are precisely aligned since the rate of etching the first passivating layer adjacent the surface of the silicon wafer can be closely controlled and since alignment required only the use of a single photomask. The junctions are formed in the surface by diffusing the dopant contained within the doped oxide portions into the surface of the silicon wafer, thereby establishing aligned junctions through the use of only a single photomasking process step. The surface of the silicon wafer is then amenable to establishment of other regions of suitable conductivity types.

It is therefore an object of the present invention to provide an improved method for the establishment of junctions in semiconductor material.

It is another object of the present invention to provide a method for the establishment of junctions in semiconductor materials without the need for sequential alignment of photomasks.

It is still another object of the present invention to define the alignment of junctions for semiconductor materials through the use of undercut passivating layers.

It is still yet another object of the present invention to provide a more economical and simplified method for the fabrication of junctions in semiconductor material.

DESCRIPTION OF THE PRESENTLY PREFERRED EMBODIMENT

Understanding a form of the present invention method for fabricating junctions in semiconductor materials can be best gained by reference to FIG. 1 wherein the steps of the present invention method are diagrammatically illustrated therein. It is understood that the relative depths of the regions of the semiconductor device as well as the passivating layers used therewith have been enlarged for the purpose of clarity only. Referring now to FIG. 1*a*, a semiconductor wafer 10 is utilized for the purpose of forming a semiconductor device. Typically, semiconductor wafer 10 will be utilized to form a great many devices therein with the process described herein being duplicated for all devices formed. Semiconductor wafer 10 is typically silicon of N type conductivity although other conventional semiconductor materials and conductivity types could be used. Passivating layers 11 and 12 are sequentially disposed upon the top surface of silicon wafer 10. Passivating layers 11 and 12 are selected such that each is etchable by a mutually exclusive etchant. In this manner, each passivating layer 11 and 12 can be etched by an etchant which will have substantially no effect on the other passivating layer. In a preferred embodiment, passivating layer 12 is silicon dioxide and passivating layer 12 is silicon nitride. Silicon dioxide can be etched in a buffered hydrofluoric acid solution and silicon nitride can be etched by a boiling phosphoric acid solution. By utilizing hydrofluoric acid to etch the silicon dioxide and phosphoric acid to etch the silicon nitride, each can be etched with substantially no effect to the other.

Figure 1A:
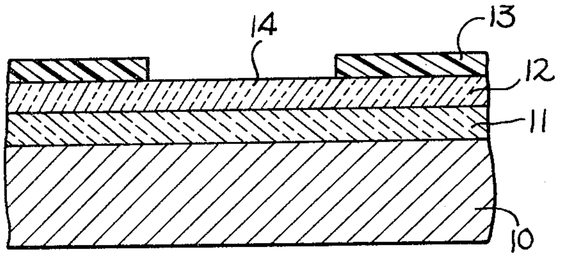
FIGS. 1*a*–1*d* diagrammatically illustrate, in cross-section, the formation of a pair of junctions in a semiconductor wafer in accordance with the present invention.

In order to expose the surface of silicon wafer 10, a photochemical process is used to accomplish same. A typical process for permitting selectable etching is a photolithographic process. Photoresist layer 13 is disposed upon silicon nitride layer 12 and a photomask is placed thereon, the photomask containing the images to define the areas to be etched. The photomask is exposed to light leaving photoresist layer 13 exposed in areas that are not to be etched. The unexposed areas of the photresist correspond to the opaque images on the photomask and can't be removed by conventional solvents. An exemplary use of a photolithographic process exposes portion 14 of silicon nitride layer 12 as shown in FIG. 1*a*.

Figure 1B:
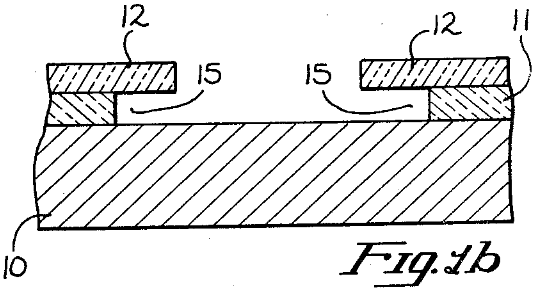

Referring now to FIG. 1*b*, an understanding of the undercutting procedure of the present invention method can be best seen. Although FIGS. 1*b* through 1*d*, FIG. 2 and FIGS. 3*a* through 3*c* do not illustrate the presence of photoresist layer 13, it is understood that the photoresist layer will be present where selectable etching and disposition of other substances will be required. The absence of the photoresist layer shown in FIG. 1*a* is for the purpose of clarity only. Referring again to FIG. 1*b*, silicon nitride layer 12 is etched by the application of a suitable etchant, namely, boiling phosphoric acid. The etchant will dissolve that portion of silicon nitride layer 12 which corresponds to the surface 14 exposed through the photolithographic process. The next step in the present invention method is the application of a suitable etchant to silicon dioxide layer 11, namely, hydrofluoric acid. Since the effect of the etchants was mutually exclusive, the phosphoric acid will have had no effect on silicon dioxide layer 11. Correspondingly, the hydrofluoric acid will have substantially no effect on silicon nitride layer 12. The application of the hydrofluoric acid solution is applied for a sufficient period of time to undercut silicon dioxide layer 11 providing undercut areas 15 which define a larger area than that defined by the etched silicon nitride layer 12.

Figure 1C:
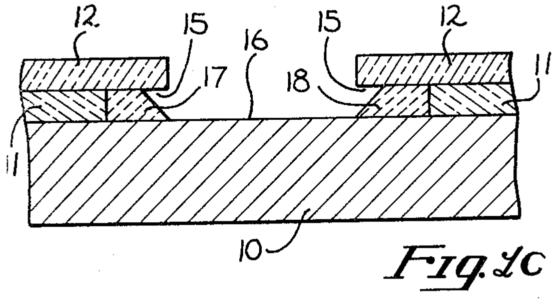

In order to form junctions in the semiconductor material, means must be provided for doping the appropriate areas of the semiconductor material. Referring now to FIG. 1*c*, the results of the next step in the present invention method can be best understood. After silicon dioxide layer 11 has been etched and undercut to provide undercut areas 15, a gaseous doping system is utilized to deposit a doped oxide upon the surface of silicon wafer 10 within the openings in silicon dioxide layers 11 and silicon nitride layers 12 and including undercut areas 15. The gaseous doping system utilized can be any conventional doping system which is appropriate for the junction to be formed. Where silicon wafer 10 is of N-type conductivity and where P+ regions are to be disposed to facilitate contacts to a base region, a doped oxide will utilize a suitable dopant for providing the P+ region, such as N-propyl borate. After the doped oxide is disposed upon the surface of silicon wafer 10 and silicon dioxide and silicon nitride layers 11 and 12 respectively, silicon wafer 10 is disposed within a solution that is appropriate to etch this doped oxide. The doped oxide is etched for a sufficiently long period to remove substantially all of the doped oxide from surface 16 of silicon wafer 10. Since it will be more difficult for a liquid etchant to reach the doped oxide established within undercut areas 15, portions 17 of doped oxide will remain in undercut areas 15. Where P+ regions are to be formed, portion 17 of doped oxide are of a P+ conductivity type.

Figure 1D:
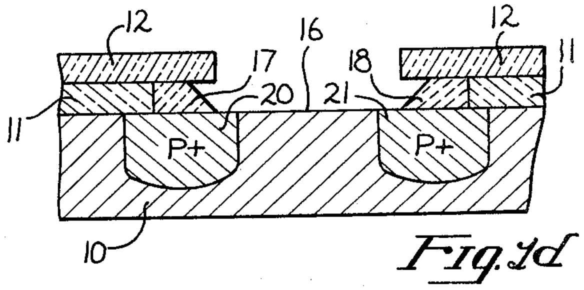

The next step in the present invention method is to form the regions of appropriate conductivity type within silicon wafer 10. Referring now to FIG. 1*d*, the next step in the present invention method can be best understood. Silicon wafer 10 with disposed portions 17 of doped oxide are subjected to a standard diffusion process, whereby the dopant embodied within portions 17 will be diffused within silicon wafer 10. The diffusion process will result in regions 20 and 21 which are of the same type of conductivity as the dopant contained within portions 17 of the doped oxide. Where an N-propyl borate doping system is used, regions 20 and 21 will be P+ regions.

The formation of the P+ regions 20 and 21 within silicon wafer 10 were accomplished through the use of only a single photolithographic process step. The initial alignment of a photomask with the appropriate image permitted etching of silicon dioxide in silicon nitride layers 11 and 12 followed by the disposition of the appropriate doped oxide and the etching thereof resulting in portions 17 of the doped oxide. Since the undercutting of silicon dioxide layer 11 can be controlled, regions 20 and 21 are precisely aligned without the need for more than a single photolithographic process step. Where silicon wafer 10 is of N-type conductivity, and where regions 20 and 21 are of P+ type conductivity, the resulting device is appropriate for the fabrication of an NPN transistor.

Figure 2:
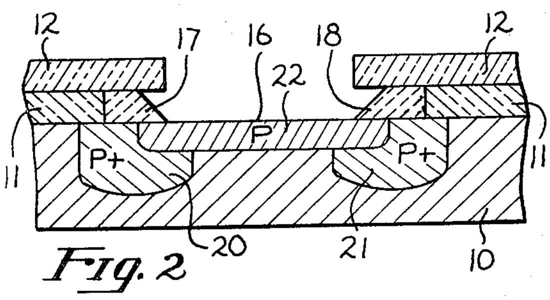
FIG. 2 illustrates in cross-section the formation of a region of a suitable conductivity type in a semiconductor wafer joining regions formed in accordance with the present invention.

Referring now to FIG. 2, a standard base diffusion for the fabrication of an NPN transistor can best be seen. Silicon wafer 10 with the etched passivating layers 11 and 12 are subjected to a conventional diffusion process whereby an appropriate dopant is disposed upon surface 16 of silicon wafer 10 to provide a source for the P type conductivity base region. After disposition of the appropriate dopant, the wafer is raised to an appropriate temperature for a suitable length of time to form region 22 having the desired electrical characteristics. The structure shown in FIG. 2 constitutes the silicon wafer 10 of N-type conductivity, base region 22 of P type conductivity as well as the P+ regions 20 and 21 for facilitating contacts to base region 22. The present invention method permits fabrication of the structure shown in FIG. 2 through the use of only a single alignment step, a method which totally precludes the need for multiple photolithographic process steps to form the associated regions.

Although the present invention method is illustrated in FIGS. 1*a* through 1*d* and FIG. 2 by the fabrication of an NPN transistor, it is understood that the present invention method is equally applicable to the fabrication of any conventional semiconductor device requiring the formation of junctions within the semiconductor material.

Figure 3A:
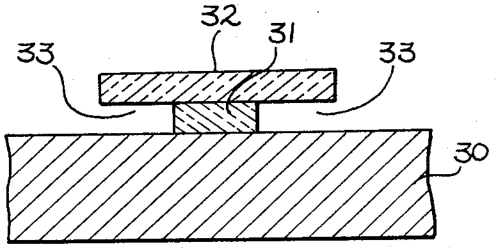
FIGS. 3*a*–3*c* diagrammatically illustrate, in cross-section, the formation of regions of different conductivity types in a semiconductor wafer in accordance with an alternate form of the present invention.
Figure 3C:
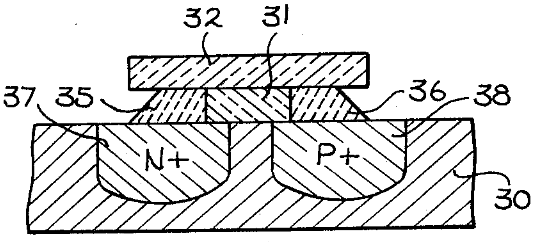
Figure 3B:
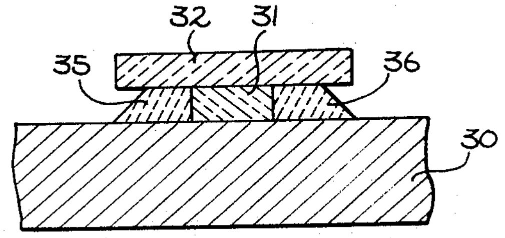

Referring now to FIGS. 3*a* through 3*c*, an alternative form of the present invention method is shown therein. Referring first to FIG. 3*a*, the initial steps of the present invention are applied to semiconductor wafer 30 and passivating layers 31 and 32. Semiconductor wafer 30 can be any conventional semiconductor material, but semiconductor wafer 30 is preferably silicon of N-type conductivity. Passivating layers 31 and 32 are conventional passivating layers, but they must be selected such that they are etchable by mutually exclusive etchants. As in the case with the device described with respect to FIG. 1*a* through FIG. 1*d*, each passivating layer 31 and 32 must be etchable by an etchant which will not effect the other passivating layer. The passivating layers 31 and 32 are typically silicon dioxide and silicon nitride, although it is understood that other passivating layers which can be etched by mutually exclusive etchants could be used in place thereof. Since the selection of which passivating layer is silicon nitride and which is silicon dioxide is merely a matter of choice, a preferred form of the present invention method disposes silicon dioxide for passivating layer 31 and silicon nitride for passivating layer 32. A single photo-etching process, typically a photolithographic process, is utilized to form undercut areas 33 defined by the surface of silicon wafer 30, the bottom surface of silicon nitride layer 32 and the side portions of silicon dioxide layer 31. As with the cast of that shown in FIG. 1*b*, undercut regions 33 can be formed since the etchants which will affect one passivating layer will have substantially no effect on the other.

Referring now to FIG. 3*b*, the results of subsequent steps of the present invention method can be best seen. In this form of the present invention method, it is sought to form junctions in the silicon wafer 30 which are of different type conductivities or of the same type conductivity but of different concentrations. In this form of the present invention method, the junctions are to be formed close together and precisely aligned through the use of only a single photolithographic step. In this form of the present invention method, the width 34 of the remaining portion of silicon nitride layer 32 can typically be as narrow as one micron with the width of the remaining portion of silicon dioxide layer 31 being approximately one-fourth micron. The etching of a silicon dioxide layer 31 with the formation of the subsequent undercut regions 33 can be easily controlled thereby permitting the formation of the narrow portions of passivating layers 31 and 32. By proper control over the photolithographic process, gaseous doping systems having a dopant of the same or different conductivity type can be disposed upon the surface of silicon wafer 30 leaving portions 35 and 36 within undercut regions 33 after a conventional etching step. Where regions of different type conductivities are to be formed in silicon wafer 30, regions 35 and 36 will be the remnants of etching doped oxides disposed from aqueous doping systems containing dopants of different conductivity types. Where portion 35 is to be used as the source for an N+ region, a gaseous doping system utilizing phosphorus, arsenic, antimony, etc. could be used. Where regions 36 is to be used as a source for a P+ region, a gaseous doping system utilizing such dopants as N-propyl borate could be used. As with the structure described with respect to FIG. 1*c*, regions 35 and 36 are formed by etching the appropriate doped oxides, regions 35 and 36 remaining because liquid etchants encounter difficulty in etching the doped oxides in undercut regions 33.

The next step in the alternative form of the present invention is illustrated in FIG. 3*c*. The structure set forth in FIG. 3*c* is heated pursuant to a conventional diffusion process, the dopant embraced within regions 35 and 36 being diffused into silicon wafer 30. Region 37 of N+ type conductivity is formed from region 35, and region 38 of P+ type conductivity is formed from region 36. Although FIG. 3*a* through FIG. 3*c* illustrate regions of different type of conductivities, it is understood that regions of the same type conductivity but of different concentrations could be formed.

The alternative form of the present invention method illustrated by FIG. 3*a* through FIG. 3*c* permits junctions to be formed in closer proximity than could be formed utilizing sequential photolithographic or other photo-etching methods. In order to form regions 37 and 38 in silicon wafer 30, only a single alignment procedure was necessary, the difficulty in the aligning two separate regions within silicon wafer 30 being eliminated.

The present invention method provides means to simultaneously form a plurality of junctions within a semiconductor material without the difficult, expensive and time consuming alignment procedures dictated by the methods taught in the prior art. Regions of the same type of conductivity but of different concentrations or of different type conductivities can be disposed within a semiconductor material through the use of only a single photolithographic or photo-etching process step. The promixity of regions disposed within a semiconductor material can be precisely controlled without the expenses and timely procedures utilized prior to the present invention. Since costly alignment techniques are eliminated, the quality of the resultant device is improved as well as reducing the fabrication costs.

I claim:

1. A method for fabricating junctions comprising the steps of:
   (a) providing a semiconductor wafer;
   (b) disposing upon said semiconductor wafer passivating means for passivating said semiconductor wafer, said passivating means adapted to be selectably removed;

(e) removing portions less than all of said doping means forming undercut regions therein;

(d) disposing doping means for providing a dopant source upon said semiconductor wafer filling the portions of said removed passivating means;

(a) removing portions less than all of said doping means leaving the remainder of said doping means in said undercut regions; and, (f) diffusing said dopant into said semiconductor wafer.

2. A method as defined in claim 1 wherein said semiconductor wafer is fabricated of silicon.

3. A method as defined in claim 1 wherein said passivating means comprises at least two passivating layers adapted to be etched by mutually exclusive etchants.

4. A method as defined in claim 3 wherein said passivating layers are silicon dioxide and silicon nitride.

5. A method as defined in claim 1 wherein said doping means comprises a gaseous dopant system adapted to form a doped oxide of a given type conductivity.

6. A method as defined in claim 1 wherein said doping means includes means for providing dopant sources of different type conductivity.

7. A method for fabricating junctions in semiconductor materials comprising the steps of:

(a) providing a semiconductor wafer of a first type conductivity having a surface;

(b) disposing a first passivating layer upon the surface of said semiconductor wafer;

(c) disposing a second passivating layer upon said first passivating layer;

(d) removing portions of said first and second passivating layers exposing the surface of said semiconductor wafer, the portion removed from said first passivating layer circumscribing the portions removed from said second passivating layer forming an undercut region thereunder;

(e) disposing an oxide having a dopant source therein upon the exposed surface of said semiconductor wafer filling said undercut region;

(f) removing said doped oxide from all but a portion of said undercut region; and, (g) diffusing said dopant into said semiconductor wafer forming a junction therein.

8. A method as defined in claim 7 wherein said semiconductor wafer is fabricated of silicon.

9. A method as defined in claim 8 wherein said silicon wafer is of N-type conductivity.

10. A method as defined in claim 7 wherein said first and second passivating layers are of different passivating materials.

11. A method as defined in claim 10 wherein said first and second passivating layers are adapted to be etched by a mutually exclusive chemical etchant.

12. A method as defined in claim 11 wherein said passivating layers are silicon dioxide and silicon nitride respectively.

13. A method as defined in claim 7 wherein said undercut regions are separated by portions of said first passivating layer.

14. A method as defined in claim 13 wherein the disposed oxide filling said undercut regions respectively contains dopants of different types of conductivity.

15. A method as defined in claim 13 wherein the disposed oxide filling said undercut regions contains dopants of the same type conductivity but of different concentrations.

16. A method for fabricating aligned junctions in semiconductor material comprising the steps of:

(a) providing a semiconductor wafer of a first type conductivity having a surface;

(b) disposing upon the surface a first passivating layer adapted to be etched by a first etchant;

(c) disposing upon said first passivating layer a second passivating layer adapted to be etched by a second etchant different from said first etchant;

(d) forming an image on said second passivating layer photolithographically;

(e) removing the portion of said second passivating layer by said second etchant corresponding to said image;

(f) removing by said first etchant a first portion of said first passivating layer corresponding to the removed portion of said second passivating layer and a second portion of said first passivating layer forming an undercut region and exposing the surface of the semiconductor wafer;

(g) disposing an oxide having a dopant source upon the exposed surface of said semiconductor wafer forming said undercut region;

(h) removing said oxide from all but said undercut region; and (i) diffusing said dopant from said dopant source into said semiconductor wafer forming a junction therein.

17. A method as defined in claim 16 wherein said semiconductor wafer is fabricated of silicon.

18. A method as defined in claim 17 wherein said silicon wafer is of N-type conductivity.

19. A method as defined in claim 16 wherein said first passivating layer is adapted to be substantially impervious to said second etchant and said second passivating layer is adapted to be substantially impervious to said first etchant.

20. A method as defined in claim 19 wherein said first passivating layer is silicon dioxide and said second passivating layer is silicon nitride.

21. A method as defined in claim 16 wherein said dopant source is a second type conductivity.

22. A method as defined in claim 16 wherein at least two undercut regions are formed separated by a portion of said first passivating layer.

23. A method as defined in claim 22 wherein dopant sources disposed in each of said undercut regions are of different types conductivities.

24. A method for fabricating aligned junctions in semiconductor materials comprising the steps of:

(a) providing a semiconductor wafer of a first type conductivity having a surface;

(b) disposing upon the surface a first passivating layer adapted to be etched by a first etchant;

(c) disposing upon said first passivating layer a second passivating layer adapted to be etched by a second etchant different from said first etchant;

(d) disposing a photosensitive layer upon said second passivating layer;

(e) exposing said photosensitive layer to light through a photomask having opaque images therein;

(f) removing portions of said photosensitive layer corresponding to said opaque images;

(g) removing a portion of said second passivating layer corresponding to the removed portion of said photosensitive layer by said second etchant;

(h) removing by said first etchant a first portion of said first passivating layer corresponding to the removed portions of said second passivating layer and a second portion of said first passivating layer forming a region undercutting said second passivating layer whereby the surface of the semiconductor wafer is exposed;

(i) disposing a doped oxide upon the exposed surface of said semiconductor wafer filling said undercut regions;

(j) removing said doped oxide from all but said undercut regions; and (k) diffusing said dopant from said doped oxide into said semiconductor wafer forming a junction therein.

25. A method as defined in claim 24 wherein said semiconductor wafer is fabricated of silicon.

26. A method as defined in claim 25 wherein said silicon wafer is of N-type conductivity.

27. A method as defined in claim 24 wherein said first passivating layer is adapted to be substantially impervious to said second etchant and said second passivating layer is adapted to be substantially impervious to said first etchant.

28. A method as defined in claim 27 wherein said first passivating layer is silicon dioxide and said second passivating layer is silicon nitride.

29. A method as defined in claim 24 wherein at least two undercut regions are formed each being separated by a portion of said first passivating layer.

References Cited

UNITED STATES PATENTS

| | | | |
|---|---|---|---|
| 3,281,291 | 10/1966 | Greenberg et al. | 148—188 X |
| 3,484,309 | 12/1969 | Gilbert | 148—33.5 |
| 3,534,234 | 10/1970 | Clevenger | 317—235 |

L. DEWAYNE RUTLEDGE, Primary Examiner

J. M. DAVIS, Assistant Examiner

U.S. Cl. X.R.

148—188; 317—235 R